(12) United States Patent
Van Treek et al.

(10) Patent No.: US 11,257,914 B2
(45) Date of Patent: Feb. 22, 2022

(54) SEMICONDUCTOR DIE, SEMICONDUCTOR DEVICE AND IGBT MODULE

(71) Applicant: Infineon Technologies AG, Neubiberg (DE)

(72) Inventors: Vera Van Treek, Unterhaching (DE); Roman Baburske, Otterfing (DE); Christian Jaeger, Munich (DE); Christian Robert Mueller, Schweinfurt (DE); Franz-Josef Niedernostheide, Hagen am Teutoburger Wald (DE); Frank Dieter Pfirsch, Munich (DE); Alexander Philippou, Munich (DE); Judith Specht, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/066,954

(22) Filed: Oct. 9, 2020

(65) Prior Publication Data

US 2021/0119003 A1 Apr. 22, 2021

(30) Foreign Application Priority Data

Oct. 21, 2019 (DE) .......................... 102019128394.9

(51) Int. Cl.
*H01L 29/417* (2006.01)
*H01L 29/06* (2006.01)
(Continued)

(52) U.S. Cl.
CPC ...... *H01L 29/41741* (2013.01); *H01L 23/535* (2013.01); *H01L 24/48* (2013.01);
(Continued)

(58) Field of Classification Search
CPC .......... H01L 29/41741; H01L 29/0696; H01L 29/7397; H01L 23/535; H01L 24/48; H01L 24/49
See application file for complete search history.

(56) References Cited

U.S. PATENT DOCUMENTS

2017/0271323 A1* 9/2017 Sugawara ........... H01L 29/1608
2020/0373392 A1* 11/2020 Hiyoshi .............. H01L 29/1608

FOREIGN PATENT DOCUMENTS

| DE | 102008008853 A1 | 9/2009 |
| DE | 102014116773 A1 | 5/2016 |
| DE | 102016113837 A1 | 2/2018 |

OTHER PUBLICATIONS

Frisch, Michael, et al., "Power module with additional low inductive current path", Power Electrics Europe, vol. 7, 2010, pp. 22-27.
(Continued)

*Primary Examiner* — Marc Anthony Armand
(74) *Attorney, Agent, or Firm* — Murphy, Bilak & Homiller, PLLC

(57) ABSTRACT

A semiconductor die includes a semiconductor body having first and second active portions. The first active portion includes first source regions. The second active portion includes second source regions. A gate structure extends from a first surface into the semiconductor body and has a longitudinal gate extension along a lateral first direction. A first load pad and the first source regions are electrically connected. A second load pad and the second source regions are electrically connected. A gap laterally separates the first and second load pads. A lateral longitudinal extension of the gap is parallel to the first direction or deviates therefrom by not more than 60 degree. A connection structure electrically connects the first and second load pads. The connection structure is formed in a groove extending from the first
(Continued)

surface into the semiconductor body and/or in a wiring layer formed on the first surface.

22 Claims, 10 Drawing Sheets

(51) Int. Cl.
    *H01L 23/535*     (2006.01)
    *H01L 23/00*     (2006.01)
    *H01L 29/739*     (2006.01)

(52) U.S. Cl.
    CPC .......... *H01L 24/49* (2013.01); *H01L 29/0696* (2013.01); *H01L 29/7397* (2013.01); *H01L 2224/4813* (2013.01); *H01L 2224/48101* (2013.01); *H01L 2224/48175* (2013.01); *H01L 2224/49111* (2013.01); *H01L 2224/49175* (2013.01)

(56) References Cited

OTHER PUBLICATIONS

Lutz, Josef, "Halbleiter-Leistungsbauelemente: Physik, Eigenschaften, Zuverlassigkeit", Berlin Heidelberg: Springer, S. 270, 2006, pp. 296-300.

* cited by examiner

SEMICONDUCTOR DIE, SEMICONDUCTOR DEVICE AND IGBT MODULE

TECHNICAL FIELD

Examples of the present disclosure relate to a semiconductor die with at least two load pads electrically connected to source regions. The present disclosure further relates to a power MOSFET (metal oxide semiconductor field effect transistor) or an IGBT (insulated gate bipolar transistor) module.

IGBTs combine the gate-drive characteristics of MOSFETs with the high-current and low-saturation voltage capability of bipolar transistors. In IGBT modules a plurality of IGBTs is electrically connected in parallel to achieve current-handling capabilities in the orders of more than 100 A.

There is a need for semiconductor dies that can be efficiently and variably used on boards, assembly groups and/or in IGBT modules.

SUMMARY

An embodiment of the present disclosure relates to a semiconductor die including a semiconductor body, a gate structure, a first load pad, a second load pad, and a connection structure. The semiconductor body includes a first active portion and a second active portion. The first active portion includes first source regions. The second active portion includes second source regions. The gate structure extends from a first surface into the semiconductor body and has a longitudinal gate extension along a lateral first direction. The first load pad and the first source regions are electrically connected. The second load pad and the second source regions are electrically connected. A gap laterally separates the first load pad and the second load pad. A lateral longitudinal extension of the gap is parallel to the first direction or deviates from the first direction by not more than 60 degree. The connection structure electrically connects the first load pad and the second load pad. The connection structure is formed in a groove extending from the first surface into the semiconductor body and/or in a wiring layer formed on the first surface.

Another embodiment of the present disclosure relates to a semiconductor device. The semiconductor device includes a semiconductor body, a first load pad, a second load pad, a metal structure, a first load connection structure, and a pad connection structure. The semiconductor body includes a first active portion and a second active portion. The first active portion includes first source regions. The second active portion includes second source regions. The first load pad and the first source regions are electrically connected. The second load pad and the second source regions are electrically connected. A gap laterally separates the first load pad and the second load pad. The first load connection structure connects the first load pad and the metal structure. The pad connection structure electrically connects the first load pad and the second load pad. The pad connection structure has a longitudinal extension angled at least 45 degree to the first load connection structure. The pad connection structure contacts the first load pad and the second load pad at a side located opposite to the semiconductor body.

Another embodiment of the present disclosure relates to an IGBT module. The IGBT module includes a semiconductor device, a metal structure and a wiring connection structure. The semiconductor device includes a semiconductor body, a first load pad, and a second load pad. The semiconductor body includes a first active portion and a second active portion. The first active portion includes first source regions. The second active portion includes second source regions. The first load pad and the first source regions are electrically connected. The second load pad and the second source regions are electrically connected. The first load pad and the second load pad are laterally separated. The wiring connection structure electrically connects the first load pad and the second load pad via the metal structure. The wiring connection structure includes bond wires. The bond wires of the wiring connection structure have an inductance of at most 20 nH.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this application. The drawings illustrate embodiments of a semiconductor die, a semiconductor device and an IGBT module and together with the description serve to explain principles of the embodiments. Further embodiments are described in the following detailed description and the claims.

DETAILED DESCRIPTION

Figure 1A:
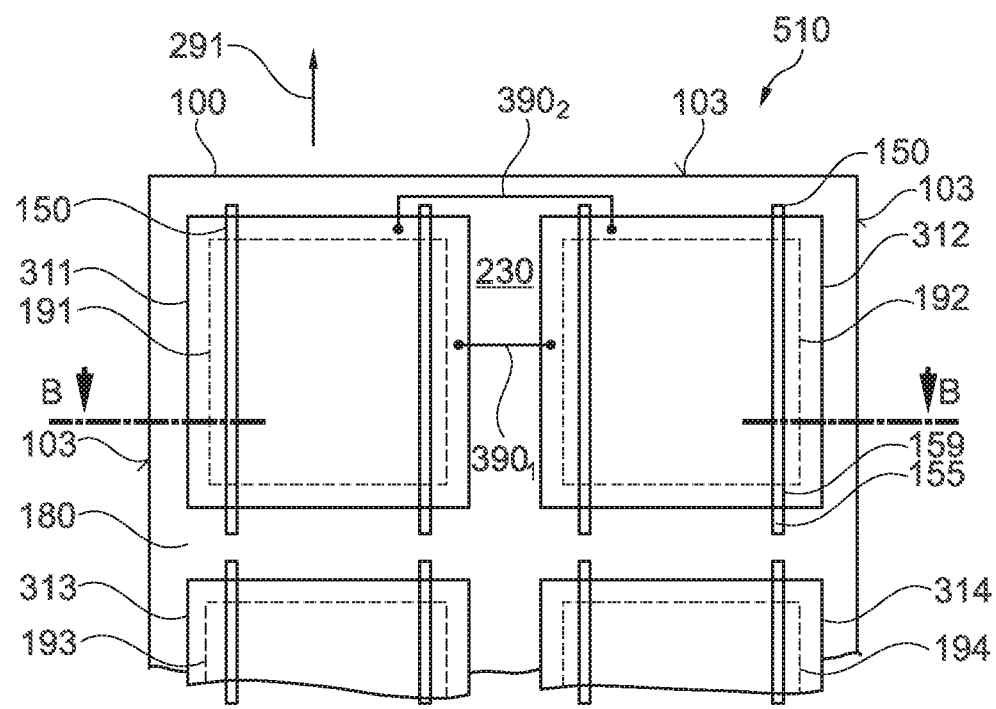
FIGS. 1A-1B illustrate a schematic plan view and a schematic cross-sectional view of a semiconductor die portion including a first load pad and a second load pad at a front side and a connection structure connecting the first load pad and the second load pad according to an embodiment.

In the following detailed description, reference is made to the accompanying drawings, which form a part hereof and in which are shown by way of illustrations specific embodiments in which a semiconductor die, a semiconductor device and an IGBT module may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct, ohmic contact between the concerned elements or a low-resistive connection via a metal and/or heavily doped semiconductor material. An ohmic contact is a non-rectifying electrical junction with a linear or almost linear current-voltage characteristic. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state.

Ranges given for physical dimensions include the boundary values. For example, a range for a parameter y from a to b reads as a≤y≤b. The same holds for ranges with one boundary value like "at most" and "at least".

Main constituents of a layer or a structure from a chemical compound or alloy are such elements which atoms form the chemical compound or alloy. For example, copper and aluminum are main constituents of a copper aluminum alloy.

The term "on" is not to be construed as meaning "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

As regards structures and doped regions formed in a substrate, a second region is "below" a first region, if a minimum distance between the second region and a first substrate main surface at the front side of the substrate is greater than a maximum distance between the first region and the first substrate main surface. The second region is "directly below" the first region, where the vertical projections of the first and second regions into the first substrate main surface overlap. The vertical projection is a projection orthogonal to the first substrate main surface.

A safe operating area (SOA) defines voltage and current conditions over which a semiconductor device can be expected to operate without self-damage. The SOA is given by published maximum values for device parameters like maximum continuous load current, maximum gate voltage and others.

The term "power semiconductor device" refers to semiconductor devices with high voltage blocking capability of at least 30V, e.g. 100V, 600V, 3.3 kV or more and with a nominal on-state current or forward current of at least 1 A, e.g. 10 A or more.

A semiconductor die includes the semiconducting portions of a semiconductor device and further structures typically formed at wafer level. For example, the semiconductor die may include a front side metallization at a front side and a back side metallization at a side opposite to the front side. The front side metallization may include one or more metal pads. A load current may flow from the metal pads through the semiconductor die to the back side metallization or from the back side metallization to the metal pads.

A semiconductor device includes at least one semiconductor die and at least one further structure formed after separation of the semiconductor die from a wafer composite. For example, a semiconductor device may include a semiconductor die, terminals, and bond wires connecting the terminals with the metal pads of the semiconductor die.

According to an embodiment, a semiconductor die may include a semiconductor body with a first active portion including first source regions and with a second active portion including second source regions.

At a front side, the semiconductor body may have a first surface with coplanar flat surface sections in a horizontal plane. At a rear side, the semiconductor body may have a flat second surface that may be essentially parallel to the first surface. A lateral surface area may connect the edge of the first surface and the edge of the second surface. A horizontal cross-section of the semiconductor body may be polygonal, e.g. approximately rectangular. For example, the semiconductor body may have the shape of a right polygonal (e.g., rectangular or hexagonal) prism with or without rounded edges. The first surface may laterally extend along a plane spanned by the lateral directions and may have a thickness along a vertical direction perpendicular to the lateral direction. The vertical extension or thickness of the semiconductor body may be in a range from 20 µm to 700 µm.

The semiconductor body may include a single-crystalline semiconductor material, e.g., silicon (Si), germanium (Ge), silicon-germanium (Site). In addition to the main constituents, the semiconductor body may include dopant atoms, for example phosphorus (P), boron (B), and/or arsenic (As). The semiconductor material may include further impurities such as hydrogen (H), fluorine (F) and/or oxygen (O).

The semiconductor body may include a first active portion and a second active portion. The first active portion and the second active portion are defined in the horizontal plane and extend from the first surface to the second surface. The first active portion and the second active portion are laterally separated from each other. The semiconductor body may include more than two active portions, for example four, six or eight active portions, wherein each active portion is laterally separated from the neighboring active portions.

The active portions conduct at least a main portion of a load current, e.g. the IGBT collector current. Each active portion includes a surface part of the first surface where the load current enters or exits the semiconductor body e.g. via load contact structures. The surface area of each active portion may be defined by the smallest convex polygon or smallest rectangle that includes all load contact structures assigned to the respective active portion. Alternatively, the surface area may be defined by the area, in which a load pad is in direct contact with the semiconductor body. Each active portion may have rectangular or approximately rectangular shape in the horizontal plane. A passive portion of the semiconductor body may laterally separate neighboring active portions and may laterally separate the active portions from the lateral surface area. The passive portion is devoid of load contact structures. A minimum distance between two load contact structures of two neighboring active portions is at least twice, e.g. at least a tenfold of the mean distance between two neighboring load contact structures in the same active portion.

The source regions are heavily doped regions of a first conductivity type within the semiconductor body. In addition to the source regions, each active portion may include further doped regions that include inter alia the semiconducting portions of an insulated-gate FET (field effect transistor) for a control portion of an IGBT.

A gate structure may extend from the first surface into the semiconductor body. The gate structure may have a longitudinal gate extension along a lateral first direction and a gate width along a lateral second direction orthogonal to the first direction. The longitudinal gate extension is greater than the gate width, e.g. at least a tenfold of the gate width. The gate structure may include a conductive gate electrode and gate dielectric separating the gate electrode from the semiconductor body.

The semiconductor die may include a plurality of parallel gate structures. For example, a first plurality of gate structures may extend at least from one side of the first active portion to an opposite side and a second plurality of gate structures may extend from one side of the second active portion to an opposite side.

The semiconductor die may include a first load pad electrically connected with the first source regions. The first load pad may be in direct contact with the first surface, wherein the first load pad and the first source regions may form low-resistive ohmic contacts. Alternatively, first load contact structures may vertically extend from the first load pad to or into the semiconductor body, wherein the first load contact structures and the first source regions form low-resistive ohmic contacts. The first load contact structures may extend through an interlayer dielectric between the first load pad and the semiconductor body.

The semiconductor die may include a second load pad electrically connected with the second source regions. The second load pad may be in direct contact with the first surface, wherein the second load pad and the second source regions may form low-resistive ohmic contacts. Alternatively, second load contact structures may vertically extend from the second load pad through the interlayer dielectric to or into the semiconductor body, wherein the second load contact structures and the second source regions form low-resistive ohmic contacts.

In an on-state of the semiconductor die, portions of the load current enter or exit the semiconductor die through the first and second load pads. The load pads may be front side emitter pads of an IGBT. The load current may flow from the first and second load pads at the front side through the semiconductor body to the second surface at the rear side of the semiconductor body or in the opposite direction.

A gap may laterally separate the first load pad and the second load pad. A lateral longitudinal extension of the gap may be parallel to the first direction or may deviate from the first direction by not more than 60 degree, not more than 45 degree or not more than 30 degree in the horizontal plane. For example, the gap may run parallel or almost parallel to the gate structure. A connection structure electrically connects the first load pad and the second load pad. The connection structure may be formed in a groove that extends from the first surface into the semiconductor body. Alternatively or in addition, the connection structure may be formed in a wiring layer formed on the first surface. For example, a portion of the interlayer dielectric may be formed between the connection structure and the semiconductor body and may separate the connection structure from the semiconductor body.

Load pads, which are arranged along a lateral direction orthogonal to the longitudinal direction of the gate structures, may be to some degree decoupled on die level. In other words, the load pads may be electrically separated on die level or may be electrically connected only through a path with comparatively high impedance, e.g., through a modestly doped region in the semiconductor body. The decoupling may result in that the load pads may have slightly different electric potentials in the operation mode. The decoupling may facilitate and/or may amplify oscillations in at least portions of the load current path of the semiconductor die, during certain operation conditions, e.g. under a short-circuit condition. The connection structure directly connects the first load pad and the second load pad on die level. The impedance of the connection structure may be selected independently from other parameters of the semiconductor die like the doping concentration in a doped region in a connection path between the first load pad and the second load pad. The impedance of the connection structure may be selected to suppress and/or damp oscillations without adverse impact on other device characteristics.

For example, the impedance may be selected such that at operation of the semiconductor die within the SOA a maximum potential difference between the first load pad and the second load pad is below a critical level. The electrical resistance of the connection structure may be at most 100 mΩ. For example, the electrical resistance may at most 10 mΩ or at most 1 mΩ. According to another example, the inductance of the connection structure may be at most 20 nH or at most 2 nH. The connection structure may combine an electrical resistance of at most 100 mΩ and an inductance of at most 20 nH, at most 10 mΩ and at most 20 nH, at most 10 mΩ and at most 2 nH, or at most 1 mΩ and at most 2 nH, by way of example. According to a further example, the damping constant of the connection structure may be in a range from 0.1 mΩ/nH to 20 mΩ/nH, e.g., in a range from 0.5 mΩ/nH to 5 mΩ/nH.

Connecting the first load pad and the second load pad on die level may give more leeway for the manner in which the semiconductor die may be electrically connected to device terminals or to other devices and/or conductive structures in a sub-assembly, e.g. in an IGBT module. For example, providing the connection structure on die level may facilitate that bond wires connected to the first and second load pads and carrying the load current may extend parallel to the gate structures. In particular, the connection structure may be combined with load pads including copper as a main constituent and with load bond wires running parallel to the gate structures, without increasing the tendency to oscillations.

According to an embodiment, the connection structure may include a trench connection structure extending into the semiconductor body. For example, the trench connection structure may extend from the first surface into the semiconductor body. The trench connection structure may include a conductive portion and an insulating portion. The insulating portion may separate the conductive portion and the semiconductor body.

The trench connection structure may be efficiently formed on wafer level by using at least partly processes that define and form the gate structures or other trench structures. Formation of the trench connection structure and formation of the gate structures and/or other trench structures may share one or more processes. For example, a single trench etch mask may define the gate structures and/or further trench structures and the trench connection structure. A single trench etch process may contemporaneously form trenches for the gate structures and/or further trench structures and one or more trenches for the connection structure. The insulating portion of the trench connection structure may be formed by using at least some of the processes applied for forming the gate dielectric. For example, a single deposition process or a single oxidation process may form at least a portion of the gate dielectric and/or another trench dielectric and the trench connection structure insulating portion. The conductive portion of the trench connection structure may be formed by using at least one of the processes for forming the gate electrode and/or passive trench electrodes. For example, a further single deposition and/or patterning process may form the gate electrode and/or a passive trench electrode and the trench connection structure conductive portion.

In addition, forming the connection structure in a trench may be with only low impact or without any negative impact on area efficiency. For example, the connection structure may be formed predominantly or completely outside any of the active portions. For example, the trench connection structure between the first load pad and the second load pad may be exclusively formed in the portion of the semiconductor body separating the first active portion and the second active portion.

The trench connection structure conductive portion may include doped polycrystalline silicon such that it is possible to finely tune the impedance of the trench connection structure by the doping concentration and the geometric dimensions of the trench connection structure.

According to an embodiment a longitudinal extension of the trench connection structure may run parallel to a longitudinal extension of the gap. The electric resistance and/or inductance of the trench connection structure may be comparatively low. A potential distribution across the first and second load pads may be comparatively uniform in any operational state.

According to another embodiment, the longitudinal extension of the trench connection structure may be tilted to a longitudinal extension of the gap, e.g. by at least 30 degree. For example, the longitudinal extension of the trench connection structure may be orthogonal to the longitudinal extension of the gap. For example, the longitudinal extension may be orthogonal to the longitudinal extension of the gap and orthogonal to the longitudinal extension of the gate structure.

According to an embodiment, the connection structure may include a plurality of trench connection structures. For example, the connection structure may include a plurality of trench connection structures running orthogonal to the longitudinal extension of the gap. The trench connection structures may be efficiently formed with approximately the same width as the gate structures and/or further trench structures.

According to an embodiment the semiconductor die may include a passive trench electrode that extends into the semiconductor body. A trench dielectric may electrically separate the passive trench electrode and the semiconductor body. The passive trench electrode may be electrically connected to a predetermined potential. For example, the passive trench electrode may be a source trench electrode electrically connected to the potential of an emitter load pad of an IGBT or a power MOSFET.

The passive trench electrode and the trench dielectric form passive trench structures. The semiconductor die may include a plurality of parallel passive trench structures. For example, a plurality of first passive trench structures may extend at least from one side of the first active portion to an opposite side and a plurality of second passive trench structures may extend from one side of the second active portion to an opposite side.

The trench connection structures may be efficiently formed together with the passive trench structures. The trench connections structures, the first passive trench structure closest to the gap and the second passive trench structure closest to the gap may form a ladder-like structure with the closest first passive trench structure and the closest second passive trench structure forming the rails and with the trench connection structures forming the rungs.

According to an embodiment, the gap between the first load pad and the second load pad may have a gap width along a direction orthogonal to the longitudinal extension of the gap. For example, the gap width may be taken along a lateral second direction orthogonal to the first direction. The gap width may be at least 2 µm. For example, the gap between the first load pad and the second load pad is devoid of further conductive structures above the first surface and the gap width may be at least 2 µm. According to another example, a further conductive structure is formed in the gap on the semiconductor body, wherein the gap width is at least 10 µm. For example, a portion of a metal gate wiring may be formed on the first surface in the gap.

According to an embodiment the connection structure may have a maximum extension along the gap width, in other words, orthogonal to the longitudinal extension of the gap. The maximum extension of the connection structure may be at most a tenfold, e.g. at most a twofold of the gap width.

According to another embodiment the connection structure may include a connection line. The connection line may be formed on the first surface of the semiconductor body. The connection line may be formed outside the gap. The connection line may be separated from the semiconductor body. For example, a portion of an interlayer dielectric structure may separate the connection line and the semiconductor body.

For example, the connection line may include a main portion extending parallel to an outer edge of the first surface in an edge portion of the semiconductor body, wherein the edge portion separates the active portions from the lateral surface area. Further portions of the connection line may laterally extend from the main portion to below the first and second load pads. Vertical vias may electrically connect the first and second load pads with the further connection line portions. Alternatively or in addition, one or more passive first trench electrodes and one or more passive second trench electrodes may extend to below the connection line and vertical vias may electrically connect the respective passive trench electrodes with the connection line. The connection line may have the only purpose of connecting the first load pad and the second load pad.

According to an embodiment, the semiconductor die includes first passive trench electrodes extending from the first surface into the first active portion. First trench contact structures may electrically connect the first load pad with the first passive trench electrodes. The first trench contact structures may vertically extend through an interlayer dielectric between the first load pad and the first passive trench electrodes. The semiconductor die may include second passive trench electrodes extending from the first surface into the second active portion. Second trench contact structure may electrically connect the second load pad and the second passive trench electrodes. The second trench contact structures may extend vertically through the interlayer dielectric between the second load pad and the semiconductor body.

A source connection line may be formed on the first surface between the active portions and the lateral surface area. The source connection line and the first passive trench electrodes may be electrically connected. For example, vias may vertically extend from the source connection line to the first passive trench electrodes. The source connection line and the second passive trench electrode may be electrically connected. For example, vias may vertically extend from the source connection line to the second passive trench electrodes.

The connection structure may include a sub-portion of the source connection line, wherein the sub-portion extends from the first passive trench electrode closest to the gap to the second passive trench electrode closest to the gap. The connection structure may be efficiently formed by modifying existing layouts.

According to an embodiment, the semiconductor body may further include a drift region, body regions and a collector region. The drift region may include a comparatively lightly doped drift zone of the first conductivity type. The drift zone may extend horizontally through the complete semiconductor body or almost through the complete semiconductor body. Dopant distribution and vertical extension of the drift zone are designed to withstand at least a main part of a nominal blocking voltage of the semiconductor die. Alternatively or in addition to the drift zone, the drift region may include a compensation structure, e.g., a superjunction structure, wherein the superjunction structure may include a plurality of p-doped columns and n-doped columns, wherein the p-doped columns and n-doped columns form vertical pn junctions, and wherein in a horizontal cross-section of the superjunction structure the surface integral across the p dopant concentration deviates by not more than 20%, e.g. by not more than 5% from the surface integral across the n dopant concentration.

First body regions in the first active portion may form first pn junctions with the drift structure and second pn junctions with the first source regions. Second body regions in the second active portion may form further first pn junctions with the drift structure and may form further second pn junctions with the second source regions.

The collector region may have the second conductivity type or may include several laterally separated zones of the second conductivity type. The collector region and the drift region may form one or more third pn junctions. The drift region is formed between the collector region at one side and the body regions at an opposite side. The drift region may separate the collector region at one side and the body regions at the opposite side.

The drift region may include further doped regions of both conductivity types. For example, the drift region may include an intermediate zone of the first conductivity type between the body regions and the drift zone. The intermediate zone may separate at least portions of the body zones from the drift zone. A maximum dopant concentration in the intermediate zone may be at least twice as high as a minimum dopant concentration in the drift zone. For example, the maximum dopant concentration in the intermediate zone may be at least tenfold the minimum dopant concentration in the drift zone.

The drift region may include a buffer layer of the first conductivity type at a side opposite to the body regions. The buffer layer may separate the drift zone and the collector region. A maximum dopant concentration in the buffer layer may be at least twice as high as a minimum dopant concentration in the drift zone. For example, the maximum dopant concentration in the buffer layer may be at least tenfold the minimum dopant concentration in the drift zone. The drift region may include intermediate regions of the second conductivity type. Each intermediate region may be formed along or close to one of the gate structures. The intermediate regions may separate at least portions of the body zones from the drift zone. The drift zone and each intermediate region may form one or more pn junctions.

According to an embodiment, a semiconductor device may include any of the semiconductor dies described above. The semiconductor device may further include a first load terminal, a gate terminal and a second load terminal. The first load terminal may be electrically connected or coupled to the first load pad and to the second load pad, e.g. through metal clips and/or bond wires, e.g., round bound wires or ribbon bond wires. The second load terminal may be electrically connected or coupled to a backside metallization formed on the second surface of the semiconductor body, e.g. through a solder layer. The backside metallization and the collector region may form a low-resistive ohmic contact. The gate terminal may be electrically connected or coupled to a gate pad, e.g. through a bond wire. The gate pad may be electrically connected or coupled with the gate electrodes in the gate structures. The semiconductor device may be a reverse blocking IGBT or a reverse conductive IGBT.

According to an embodiment, a semiconductor device may include a semiconductor body, a first load pad, a second load pad, a metal structure, a first load connection structure and a pad connection structure.

The semiconductor body may include a first active portion and a second active portion. The first active portion may include first source regions. The second active portion may include second source regions. The first load pad and the first source regions may be electrically connected. The second load pad and the second source regions may be electrically connected. A gap may laterally separate the first load pad and the second load pad. A first load connection structure may connect the first load pad and the metal structure. A pad connection structure may electrically connect the first load pad and the second load pad. The connection structure may have a longitudinal extension angled at least 45° to the first load connection structure. The connection structure may contact the first load pad and the second load pad at a side located opposite to the semiconductor body.

The connection structure directly connects the first load pad and the second load pad. The impedance of the connection structure may be selected independently from other wiring connections between the load pads and further structures. The impedance of the connection structure may be selected to suppress and/or damp oscillations, which may occur in at least portions of the load current path under certain operation conditions, without adverse impact on other wiring parameters.

A gate structure may extend from a first surface into the semiconductor body. The gate structure may have a longitudinal gate extension along a lateral direction. The longitudinal gate extension may have an angle of less than 45 degree to the longitudinal extension of the first load connection structure. The longitudinal gate extension is greater than a gate width orthogonal to the longitudinal gate extension, e.g. at least a tenfold of the gate width. The gate structure may include a conductive gate electrode and gate dielectric separating the gate electrode from the semiconductor body. The semiconductor die may include a plurality of parallel gate structures.

According to an embodiment, the first load connection structure may include at least one load bond wire. For example, the first load connection structure may include at least two load bond wires, e.g. four, five or six load bond wires. All load bond wires of the first load connection structure may be arranged electrically in parallel. All load bond wires of the first load connection structure may be of the same type, same material and/or same cross-sectional area. For example, the load bond wires may be round bond wires or ribbon bond wires.

At least above the first load pad, the load connection structure, e.g., the one or more bond wires may extend approximately parallel to a longitudinal extension of the gap. The load connection structure may run parallel or approximately parallel to gate structures formed in the semiconductor body. The load connection structure may further contact a top surface of a third load pad of the semiconductor device. The connection structure may at least partly compensate effects, which may be caused by the inductance and/or the resistance of the load bond wires, on oscillations in the load current path.

According to an embodiment the pad connection structure may include a bond wire in direct contact with the first load pad and in direct contact with the second load pad. The bond wire may be a round bond wire or a ribbon bond wire. The bond wire may be attached to an exposed top surface of the first load pad and to an exposed top surface of the second load pad. The pad connection structure may be efficiently provided by a moderate modification of a wire bonding process.

According to an embodiment the semiconductor device may further include a second load connection structure that connects the second load pad and the metal structure. The second load connection structure may include at least one load bond wire. For example, the second load connection structure may include two, four, five or six load bond wires. All load bond wires of the second load connection structure may be electrically parallel. All load bond wires of the second load connection structure may be of the same type, same material and/or same cross-sectional area. For example, the load bond wires may be round bond wires or ribbon bond wires.

The first load connection structure and the second load connection structure may be separated. The first load connection structure and the second load connection structure may be different entities. The first load connection structure and the second load connection structure may be of the same material or may be from different materials.

According to an embodiment an electrical path of the connection structure is at least 50% shorter than an electrical path formed between the first load pad and the second load pad through the first load connection structure, the metal structure and the second load connection structure.

According to an embodiment an IGBT module may include at least one of a semiconductor device as described above and a semiconductor die as described above.

According to an embodiment, an IGBT module may include a semiconductor die, a metal structure, and a wiring connection structure. The semiconductor die may include a semiconductor body, a first load pad and a second load pad. The semiconductor body may include a first active portion and a second active portion. The first active portion may include first source regions. The second active portion may include second source regions. The first load pad and the first source regions may be electrically connected. The second load pad and the second source regions may be electrically connected. The first load pad and the second load pad are laterally separated. A wiring connection structure may connect the first load pad and the second load pad via the metal structure. The wiring connection structure may include bond wires. The bond wires of the wiring connection structure may have an inductance of at most 5 nH, e.g. at most 2 nH and/or a total damping constant (R/2L) of at least $5*10^5$ s$^{-1}$ (5E5 1/s). The inductance of the wiring connection structure may be sufficiently low to efficiently suppress and/or damp oscillations in portions of the load current path.

A gate structure may extend from a first surface into the semiconductor body. The gate structure may have a longitudinal gate extension along a lateral direction. The longitudinal gate extension may have an angle of less than 45 degree to the length extension of the wiring connection structure. The longitudinal gate extension is greater than a gate width orthogonal to the longitudinal gate extension, e.g. at least a tenfold of the gate width. The gate structure may include a conductive gate electrode and gate dielectric separating the gate electrode from the semiconductor body. The semiconductor die may include a plurality of parallel gate structures.

According to an embodiment the metal structure may include at least one of a load current plate, a Kelvin support structure, and an electrode pad of a further semiconductor device. The further semiconductor device may be a power semiconductor diode electrically connected antiparallel to the semiconductor die, by way of example. For example, a lateral distance between the semiconductor die and the load current plate, a lateral distance between the semiconductor die and the Kelvin support structure, and/or the lateral distance between the semiconductor die and the further semiconductor device is at most 2 mm, for example for a semiconductor device with a blocking capability of at most 1200V.

According to an embodiment the bond wires of the wiring connection structure may have an inductance of at most 1 nH.

Figure 1B:
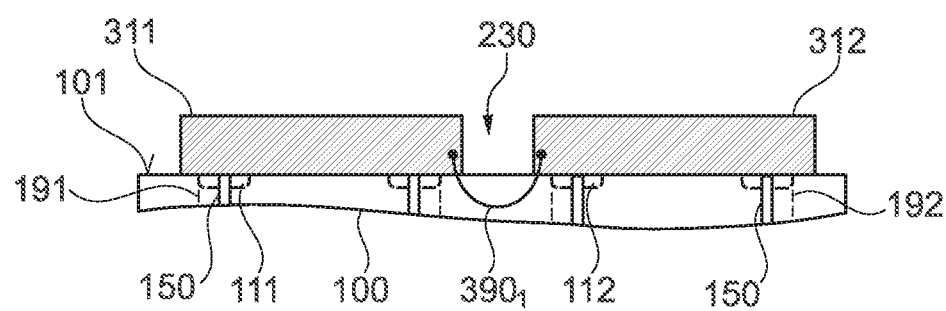

FIGS. 1A-1B illustrate a portion of a semiconductor die 510 including a connection structure 390 electrically connecting a first load pad 311 and a second load pad 312 at a front side of the semiconductor die 510.

The semiconductor die 510 may be a bare die of an IGBT, e.g. of a reverse blocking IGBT or of an RC-IGBT (reverse conducting IGBT). A semiconductor body 100 of the semiconductor die 510 may be mainly formed from a single crystalline semiconductor material, for example silicon (Si), germanium (Ge), a silicon-germanium crystal (SiGe), silicon carbide (SiC), gallium nitride (GaN) or gallium arsenide (GaAs), by way of example.

The semiconductor body 100 has a first surface 101 at the front side. In a horizontal plane parallel to the first surface 101 the semiconductor body 100 may have a rectangular shape. A normal to the first surface 101 defines a vertical direction and directions orthogonal to the vertical direction are lateral directions. The semiconductor body 100 may include active portions 191, 192, 193, 194 defined side-by-sides in the horizontal plane. The active portions 191, 192, . . . are laterally separated from each other. For example, the active portions 191, 192, . . . may be regularly arranged in rows and lines. A grid-shaped passive portion 180 laterally separates the active portions 191, 192, . . . from each other and from a lateral surface area 103 at the edge of the semiconductor body 100.

In the active portions 191, 192, . . . the semiconductor body 100 includes the semiconducting portions of an IGFET-like structure that controls an IGBT. Inter alia, a first active portion 191 includes first source regions 111 of a first conductivity type. The second active portion 192 includes second source regions 112 of the first conductivity type. The third active portion 193 includes third source regions of the first conductivity type. The fourth active portion 194 includes fourth source regions of the first conductivity type. The source regions 111, 112, . . . may extend from the first surface 101 into the semiconductor body 100. The first conductivity type may be n-type, by way of example. Alternatively, the first conductivity type may be p-type.

Gate structures 150 extend from the first surface 101 into the semiconductor body 100. The gate structures 150 have a longitudinal gate extension along a lateral first direction 291. The gate structures 150 may laterally extend from one side of an active portion 191, 192 to the opposite side and may on both sides extend into the passive portion 180. Each gate structure 150 may laterally extend through two active portions 191, 193, 192, 194 arranged along the first direction 291 and through the section of the passive portion 180 between the two pertinent active portions 191, 193, 192, 194 (not illustrated). Each source region 111, 112, . . . may directly adjoin to one or more gate structures 150.

The gate structures 150 may include a gate electrode 155 and a gate dielectric 159 separating the gate electrode 155 and the semiconductor body 100. The gate electrode 155 may be a homogeneous structure or may have a layered structure including one or more conductive layers. For example, the gate electrode 155 may include heavily doped polycrystalline silicon and/or a metal element or a metal compound. The gate dielectric 159 may include a semiconductor oxide, for example thermally grown or deposited silicon oxide, a semiconductor nitride, for example deposited or thermally grown silicon nitride, a semiconductor oxynitride, for example silicon oxynitride and/or dielectric layer stacks including ferroelectric material such as hafnium oxide $HfO_2$ or $BaTiO_3$.

Load pads 311, 312, . . . are located above each active portion 191, 192, . . . . For example, a first load pad 311 is formed above the first active portion 191 a second load pad 312 is formed above the second active portion 192 and so on. Each load pad 311, 312, . . . may have the same horizontal cross-sectional shape as the corresponding active portion 191, 192, . . . . The horizontal cross-sectional area of each load pad 311, 312, . . . may be equal to or greater than the horizontal cross-sectional area of the corresponding active portion 191, 192, . . . . Each load pad 311, 312, . . . is electrically connected at least with the source regions 111, 112, . . . of the respective active portion 191, 192, . . . . The load pads 311, 312, . . . are separated from the gate electrodes 155.

The load pads 311, 312, . . . may include aluminum or copper as the only main constituent or as one of several main constituents. For example, the load pads 311, 312, . . . may include a copper alloy, e.g., a copper aluminum alloy (CuAl) with or without silicon (Si), or an aluminum alloy, e.g. AlSi or AlSiCu.

A gap 230 laterally separates the first load pad 311 and the second load pad 312. The gap 230 has a longitudinal extension parallel to the first direction 291. A connection structure $390_1$, $390_2$ electrically connects the first load pad 311 and the second load pad 312. The connection structure $390_1$, $390_2$ may include a portion formed in a trench, which extends into the semiconductor body 100, and/or a portion formed in a wiring layer on the first surface 101.

Figure 2A:
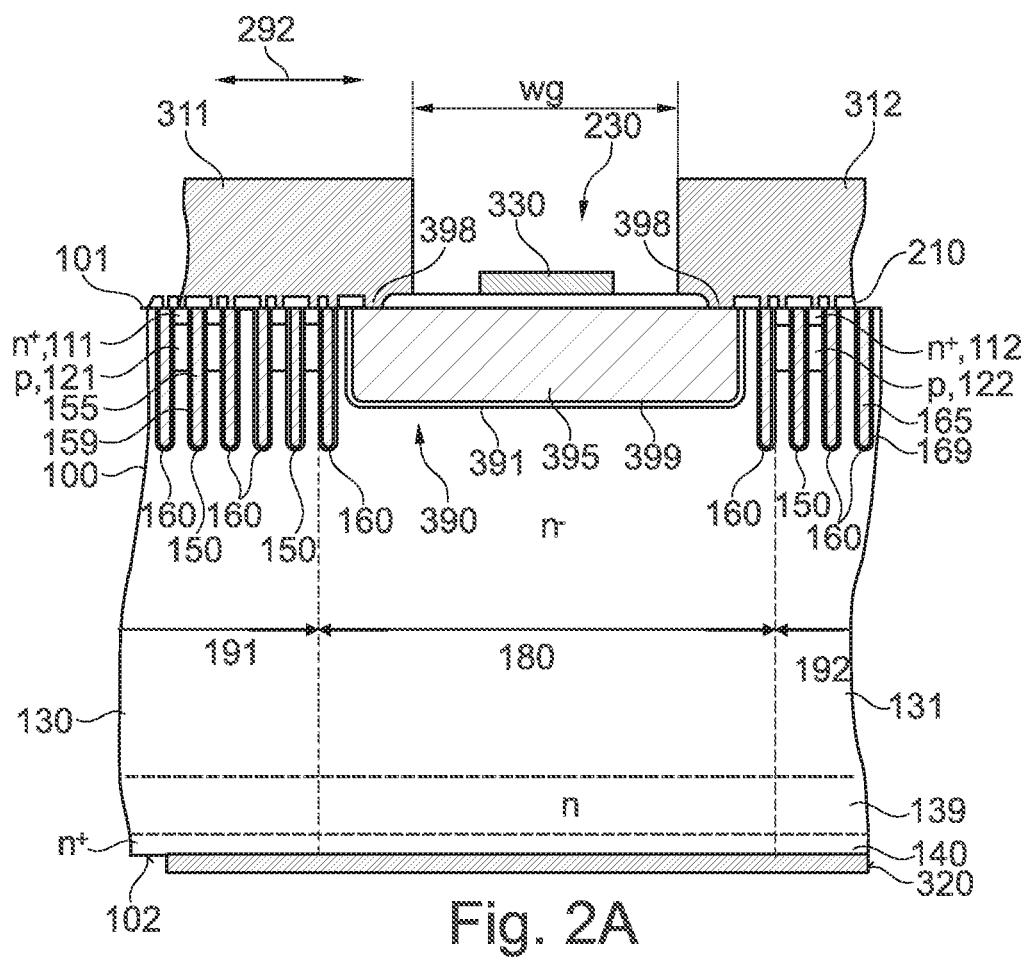
FIGS. 2A-2B illustrate a schematic cross-sectional view and a schematic plan view of a semiconductor die portion according to an embodiment with a connection structure formed in a trench.
Figure 2B:
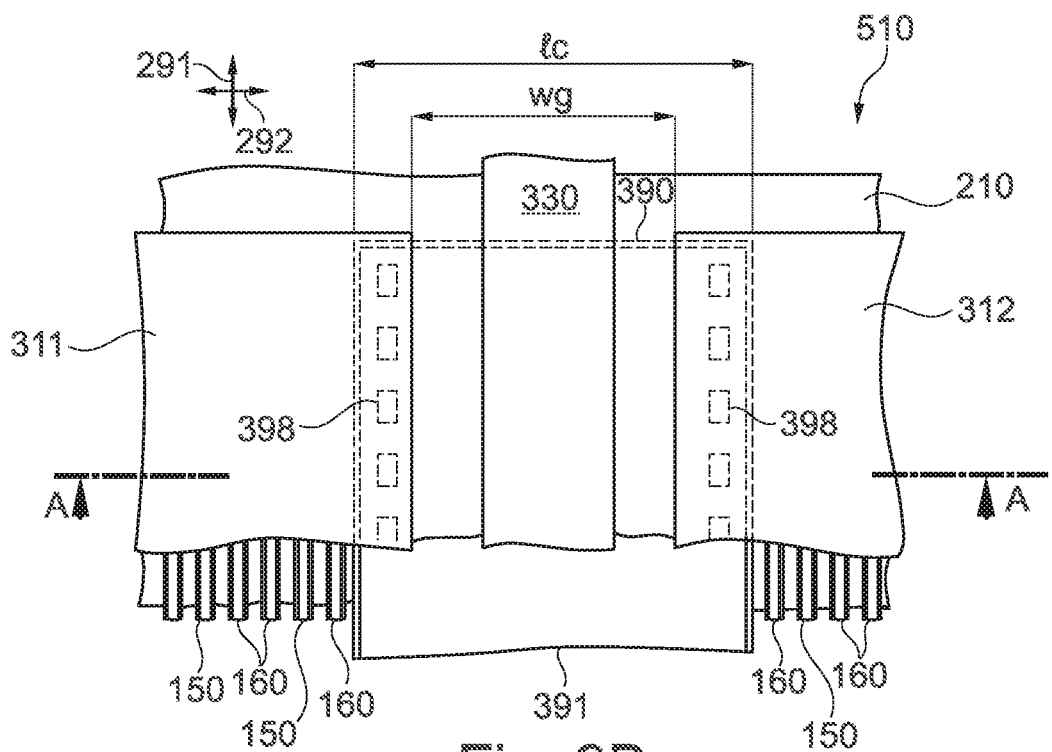

FIGS. 2A-2B refer to embodiments including a trench connection structure 391. FIGS. 2A-2B also show details of IGBTs with passive electrode trench structures 160.

FIG. 2A shows a semiconductor body 100 with a first surface 101 at a front side and with a second surface 102 at the rear side. The first surface 101 and the second surface 102 are approximately parallel. A minimum distance between the first surface 101 and the second surface 102 depends on a voltage blocking capability specified for the semiconductor die 510. For example, the distance between the first surface 101, and the second surface 102 may be in a range from 90 µm to 120 µm for a semiconductor die 510 based on silicon (Si) and specified for a blocking voltage of about 1200 V. Other embodiments related to semiconductor dies with larger blocking capability may provide semiconductor bodies 100 with a thickness of several 100 µm. For semiconductor dies with lower blocking voltage the thickness may be in a range from 35 µm to 90 µm for silicon (Si).

The semiconductor body 100 includes a drift region 130, source regions 111, 112 body regions 121, 122 and a collector region 140. The drift region 130 may include a comparatively lightly doped drift zone 131 of the first conductivity type. The drift zone may extend horizontally through the complete semiconductor body 100 or almost through the complete semiconductor body 100. The drift zone forms a voltage sustaining layer. Dopant distribution and vertical extension of the drift zone 131 are selected to withstand at least a main part of a nominal blocking voltage of the semiconductor die 510. The dopant concentration in the drift zone 131 may gradually or in steps increase or decrease with increasing distance to the first surface 101 at least in portions of its vertical extension. According to other embodiments, the dopant concentration in the drift zone 131 may be approximately uniform. For IGBT dies based on silicon, a mean dopant concentration in the drift zone 131 may be between $5 \times 10^{12}$ (5E12) $cm^{-3}$ and $1 \times 10^{15}$ (1E15) $cm^{-3}$, for example in a range from $1 \times 10^{13}$ (1E13) $cm^{-3}$ to $1 \times 10^{14}$ (1E14) $cm^{-3}$. Between the drift zone 131 and the collector region 140 the drift region 130 may include a buffer layer 139 of the first conductivity type. The buffer layer 139 may separate the drift zone 131 and the collector region 140. A maximum dopant concentration in the buffer layer 139 may be at least twice as high as a maximum dopant concentration in the drift zone 131.

First body regions 121 form first pn junctions with the drift region 130 and second pn junctions with the first source regions 111. The first body regions 121, the first source regions 111 and the first load pad 311 may be electrically connected. Second body regions 122 may form further first pn junctions with the drift region 120 and may form further second pn junctions with the second source regions 112. The second body regions 122, the second source regions 112 and the second load pad 312 may be electrically connected.

The collector region 140 is configured to act as a rear side emitter. For a non-reverse-conducting IGBT, e.g. a standard IGBT with a reverse blocking capability significantly lower than the forward blocking capability or an RC-IGBT with the forward blocking capability and the reverse blocking capability within the same order of magnitude, the collector region 140 may be a continuous layer of the second conductivity type. For an RC-IGBT the collector region 140 may include first zones of the first conductivity type and second zones of the second conductivity type. The first zones and the second zones are, for example, alternatingly arranged along the horizontal direction. The collector region 140 (or the first and second zones of an RC-IGBT collector region 140) and a rear side metallization 320 form an ohmic contact. A maximum dopant concentration in the collector region 140 may be at least $1\times10^{16}$ (1E16) $cm^{-3}$, for example at least $5\times10^{17}$ (5E17) $cm^{-3}$.

The semiconductor body 100 may also include advanced IGBT cell design elements like various trenches with different functionalities, i.e. some trench electrodes being connected to gate potential and some trench electrodes being connected to another potential like the load terminal or even kept floating. Also, hole barrier layers of the same conductivity type as the source regions may be implemented between the body regions and the drift region to improve device characteristics. Alternatively or additionally, floating barrier regions of the same conductivity type as the body regions may be implemented in the semiconductor body 100, for example floating barrier regions forming pn junctions with portions of the drift zone 131.

In particular, FIGS. 2A-2B show passive trench structures 160 extending from the first surface 101 into the semiconductor body 100. The passive trench structures 160 may be stripe-shaped structures extending parallel to the gate structures 150.

The passive trench structures 160 may include a passive trench electrode 165 and a trench dielectric 169 separating the passive trench electrode 165 and the semiconductor body 100. The passive trench electrode 165 may be a homogenous structure or may have a layered structure including one or more conductive layers. For example, the passive trench electrode 165 may include a heavily doped polycrystalline silicon layer. The passive trench electrode 165 and the gate electrode 155 may have the same configuration and may include the same materials.

The trench dielectric 169 may include a semiconductor oxide, for example thermally grown or deposited silicon oxide, a semiconductor nitride, for example deposited or thermally grown silicon nitride or a semiconductor oxynitride, for example silicon oxynitride. The trench dielectric 169 and the gate dielectric 159 may have the same configuration and/or may include the same materials.

Gate structures 150 and passive trench structures 160 may alternate in a regular fashion. For example, one single passive trench structure 160 may be arranged between each pair of gate structures 150. According to other embodiments, two, three or more passive trench structures 160 may be arranged between each pair of gate structures 150. According to other embodiments, the passive trench structures may be omitted and the semiconductor die 510 may exclusively include gate structures 150.

The gate electrode 155 may be electrically connected to a metal gate wiring 330 formed at the front side of the semiconductor body 100. The passive trench electrode 165 is electrically separated from the gate electrode 155. The passive trench electrode 165 may be electrically connected to an auxiliary structure or may be electrically floating. According to the illustrated embodiment the passive trench electrode 165 of an active portion 191, 192, . . . is electrically connected with the load pad 311, 312, . . . assigned to the active portion 191, 192, . . . in which the passive trench electrode 165 is formed.

A gap 230 between the first load pad 311 and the second load pad 312 may have a longitudinal axis parallel to the first direction 291. In other words, a longitudinal extension of the gap 230 may be parallel to the gate structures 150. The gap 230 has a gap width wg along a second direction 292 orthogonal to the first direction 291.

The trench connection structure 391 includes a conductive portion 395 and an insulating portion 399 separating the conductive portion 395 and the semiconductor body 100.

The trench connection structure 391 may be formed symmetrically with respect to a center plane in the center of the gap 230 and extending along the first direction 291. A portion of a metal gate wiring 330 may be formed in the gap 230 on the first surface 101. A portion of an interlayer dielectric 210 separates the metal gate wiring 330 from the trench connection structure conductive portion 395 and from the semiconductor body 100. The interlayer dielectric 210 further separates the load pads 311, 312 from the gate electrode 155 in the gate structures 150.

First load contact structures 318 vertically connect the first load pad 311 with the first source regions 111, with the first body regions 121 and with the passive trench electrodes 165 in the first active portion 291. Second load contact structures 319 vertically connect the second load pad 312 with the second source regions 112, with the second body regions 122 and with the passive trench electrodes 165 in the second active portion 292.

Connection vias 398 vertically connect the first load pad 311 and the connection structure conductive portion 395 and vertically connect the second load pad 312 and the connection structure conductive portion 395. A lateral extension lc of the trench connection structure 391 along the second direction 292 is greater than the gap width wg and smaller than a distance between that trench structure 150, 160 closest to the gap 230 in the first active portion 191 and that trench structure 150, 160 closest to the gap 230 in the second active portion 192.

Figure 3A:
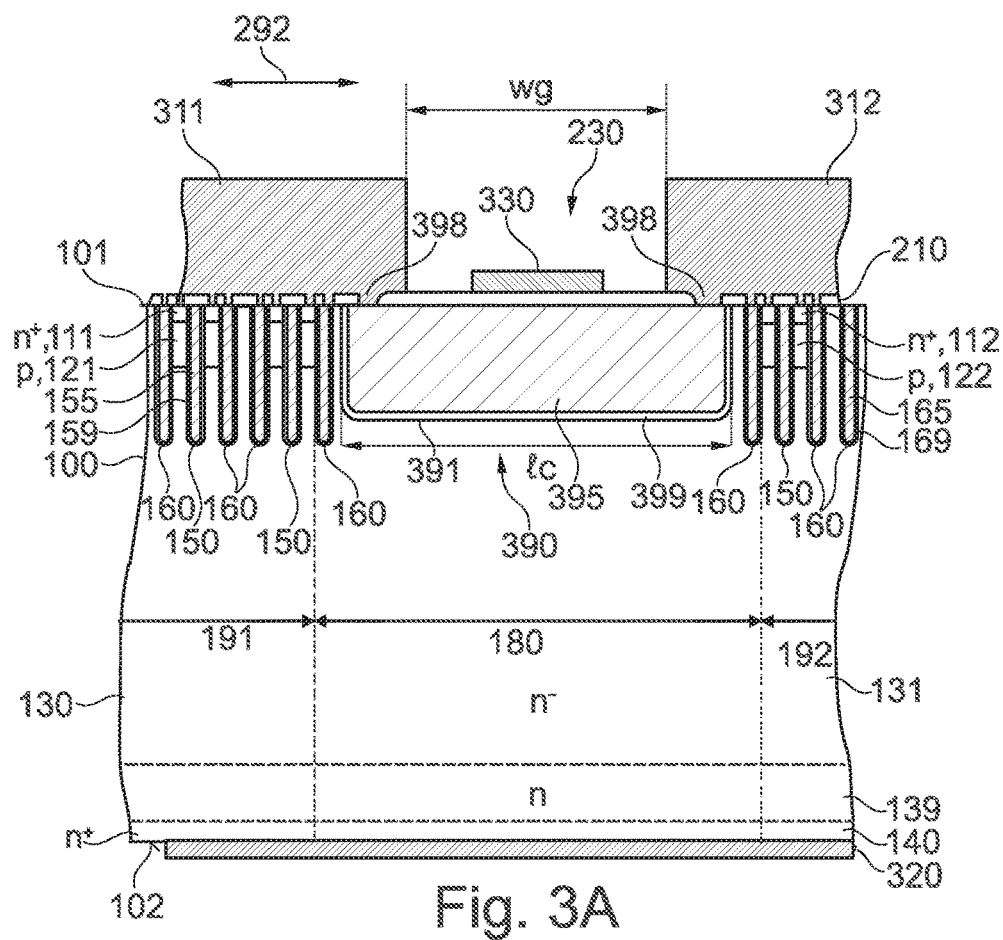
FIGS. 3A-3B illustrate a schematic cross-sectional view and a schematic plan view of a semiconductor die portion according to an embodiment with a plurality of connection structures formed in trenches.
Figure 3B:
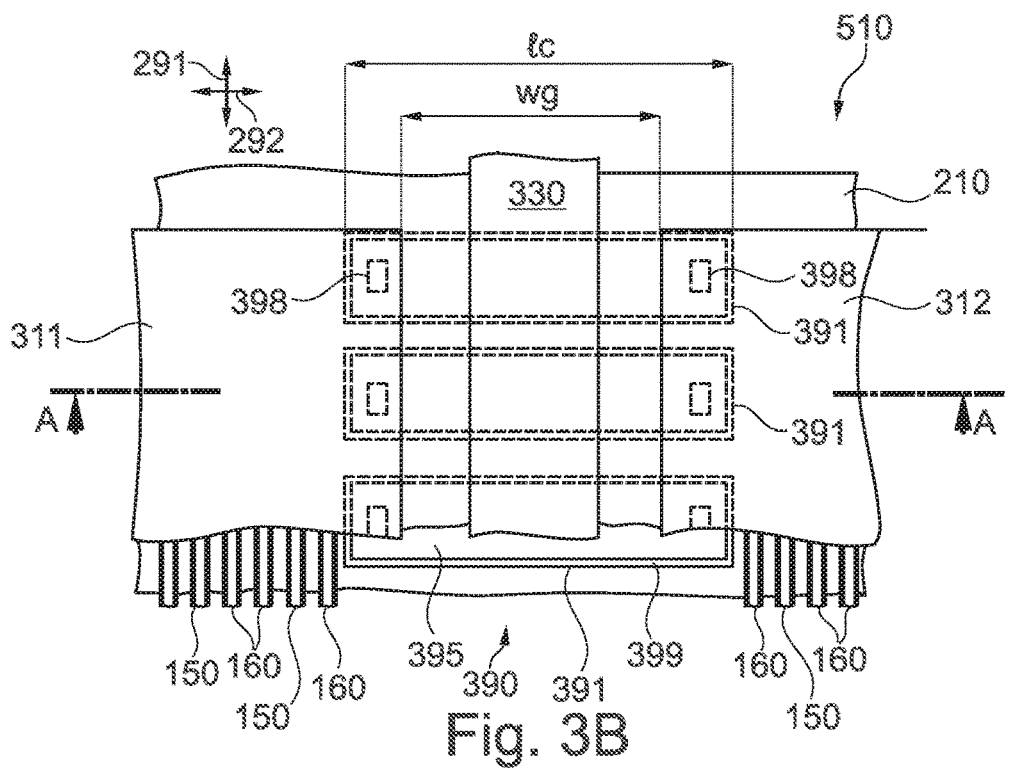

FIGS. 3A-3B show a connection structure 390 including a plurality of trench connection structures 391 oriented parallel to each other. In the illustrated embodiment the trench connection structures 391 are oriented with the longitudinal axes running orthogonal to the longitudinal extension of the gate structures 150. The trench connection structures 391 and the gate structures 150 may have the same width and/or may have the same vertical extension. According to another embodiment (not illustrated) an angle between the longitudinal axes of the trench connection structures 391 and the second direction 292 may be 45 degree or smaller, e.g., 30 degree.

Figure 4A:
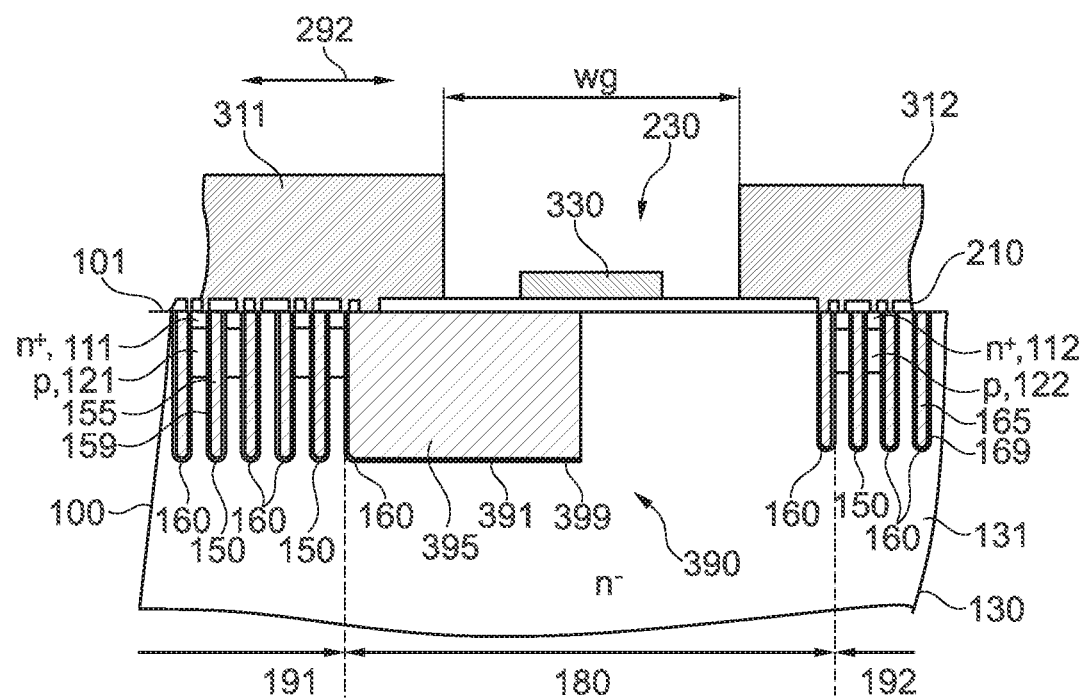
FIGS. 4A-4B illustrate a schematic cross-sectional view and a schematic plan view of a semiconductor die portion according to an embodiment with a connection structure extending between two trench electrode structures.
Figure 4B:
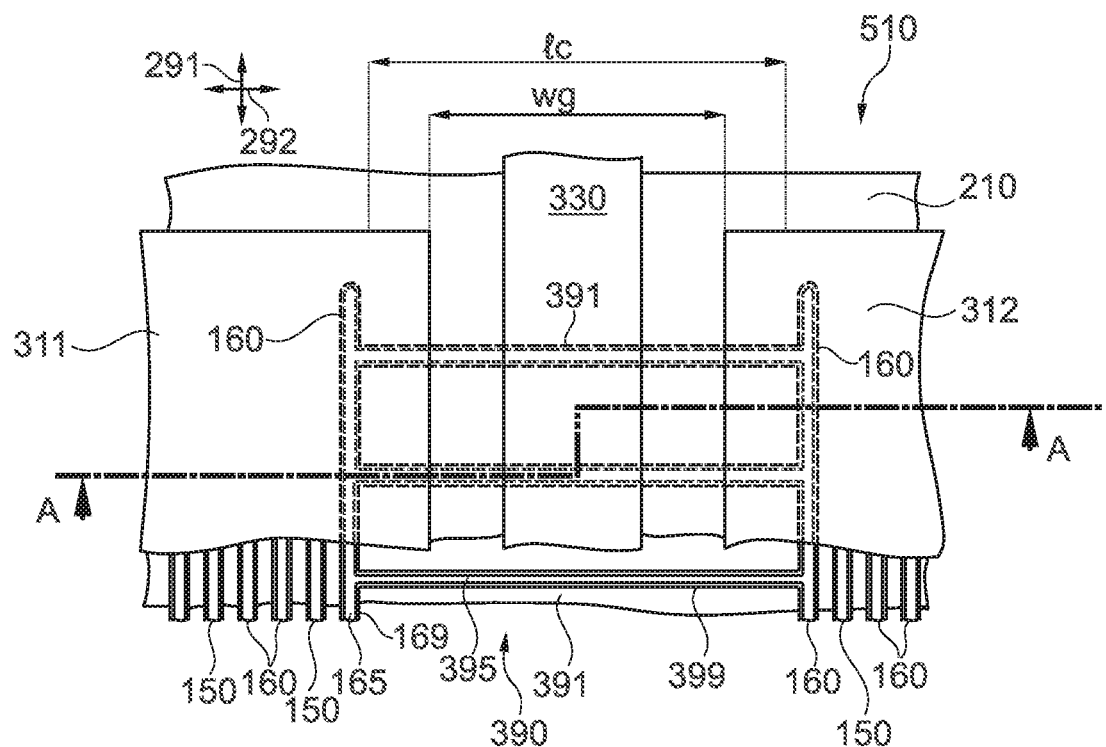

In FIGS. 4A-4B each trench connection structure connects that passive trench structure 160 of the first active portion 191, which is closest to the gap 230, with that passive trench structure 160 in the second active portion 192, which is closest to the gap 230. The conductive portion 395 of the connection structure 390 and the passive trench electrode 165 are directly connected.

Between that passive trench structure 160 of the first active portion 191, which is closest to the gap 230, and that passive trench structure 160 in the second active portion 192, which is closest to the gap 230, the semiconductor body 100 is devoid of gate structures 150. The trench connection structures 391 and the passive trench structures 160 may have the same width and/or may have the same vertical extension.

The trench connection structures 391, and the first passive trench structure 160 on each side of the gap 230 may form a ladder-like structure with the closest passive trench structure 160 in the first active portion 191 and the closest passive trench structure 160 in the second active portion 192 forming the rails and with the trench connection structures 391 forming the rungs.

Figure 5A:
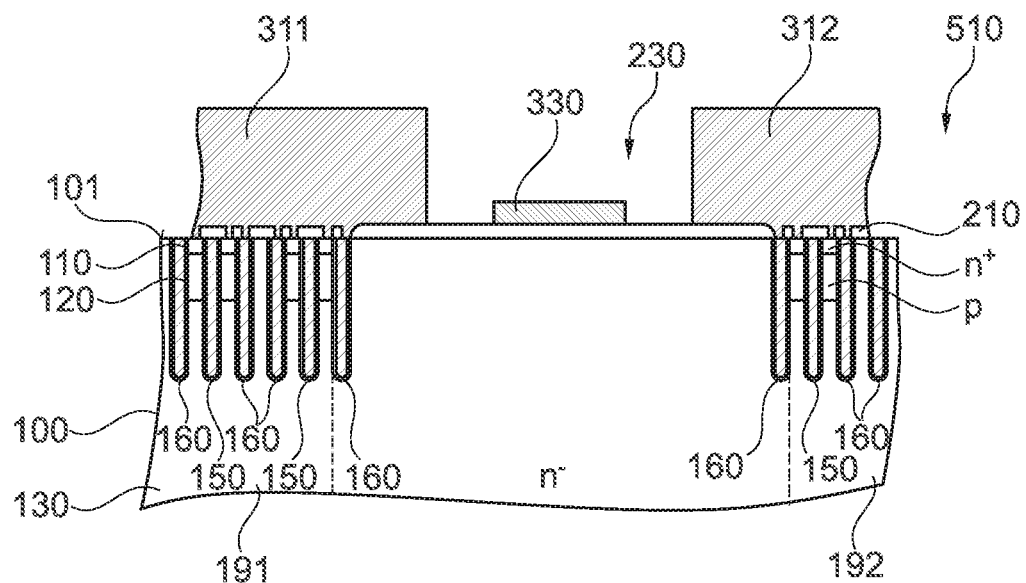
FIGS. 5A-5B illustrate a schematic cross-sectional view and a schematic plan view of a semiconductor die portion according to an embodiment with a connection structure formed in a wiring plane.
Figure 5B:
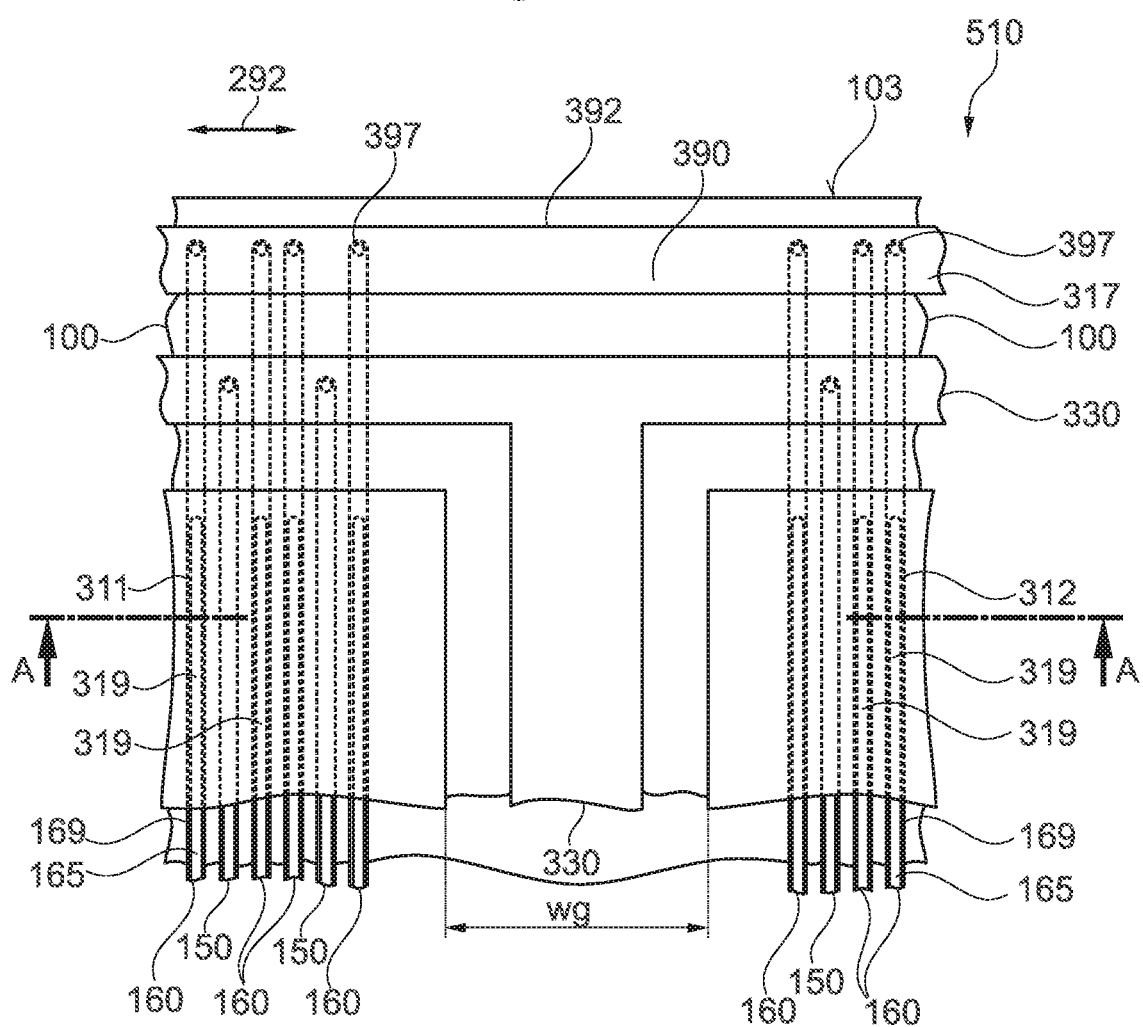

FIGS. 5A-5B show a connection structure 390 including a connection line 392 formed in a wiring layer on the front side of the semiconductor body 100. The connection line 392 is formed on the semiconductor body 100 and outside the gap 230. For example, the connection line 392 is formed on the passive portion 180 of the semiconductor body 100 between the lateral surface area 103 and the first and second active portions 191, 192. The passive trench structures 160 laterally extend from the active portions 191, 192 to below the connection line 392. Vias 397 vertically connect the connection line 392 and the passive trench electrodes 165.

The connection line 392 may be a part of a source runner 317 extending along the complete lateral extension of the active portions 191, 192 along the second lateral direction 292 between the active portions 191, 192 and the lateral surface area 103. According to another embodiment the connection line 392 may be shorter than the extension of the active portions 191, 192 along the second direction, e.g., at most a tenfold or a twofold of the gap width wg.

Figure 6:
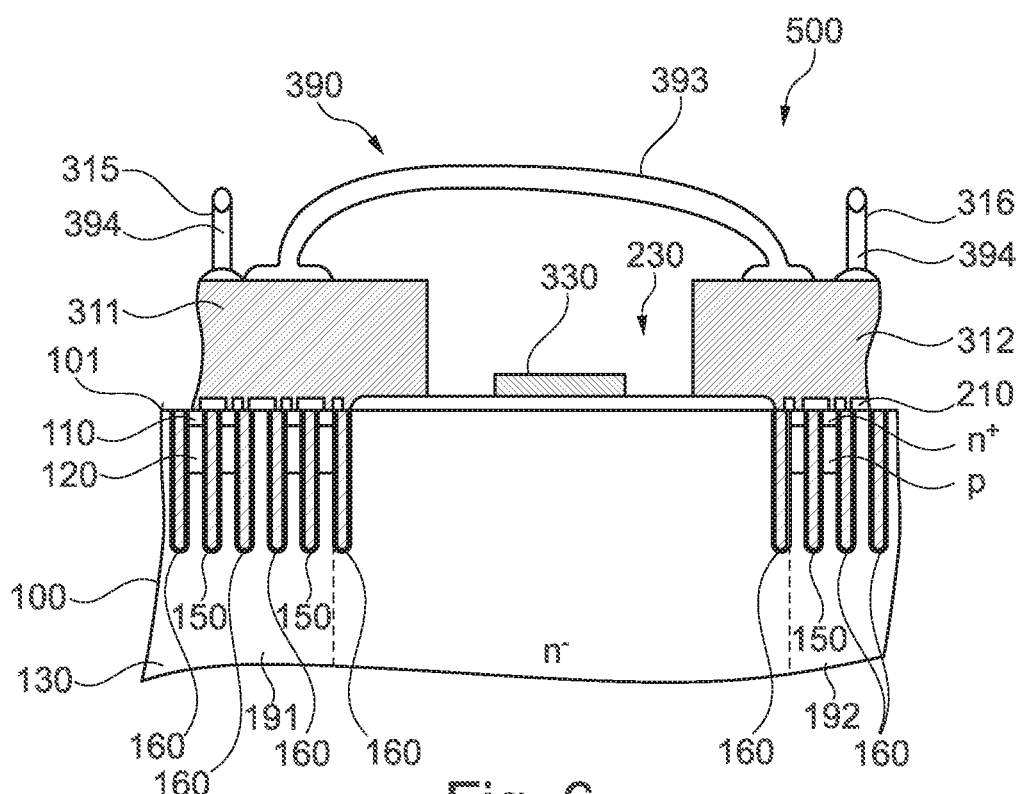
FIG. 6 illustrates a schematic cross-sectional view of a semiconductor device portion according to an embodiment including a pad connection structure with a bond wire.

The pad connection structure 390 of the semiconductor device 500 in FIG. 6 includes one or more bond wires 393 attached onto the exposed top surface of the first load pad 311 and the second load pad 312. The bond wire 393 bridges the gap 230. A first load connection structure 315 electrically connects the first load pad 311 with a terminal and/or with another metal structure (not illustrated). The first load connection structure 315 may include a plurality of parallel bond wires 394 extending approximately parallel or slightly tilted to the longitudinal direction of the gate trenches 150. A second load connection structure 316 connects a second load pad 312 with a terminal and/or with another metal structure. The second load connection structure 316 may include a plurality of parallel bond wires 394 extending approximately parallel or slightly tilted to the longitudinal direction of the gate structures 150.

An electrical path of the bond wire 393 is at least 50% shorter than an electrical path formed between the first load pad 311 and the second load pad 312 through the first load connection structure 315, the terminal or metal structure and the second load connection structure 316.

Figure 7A:
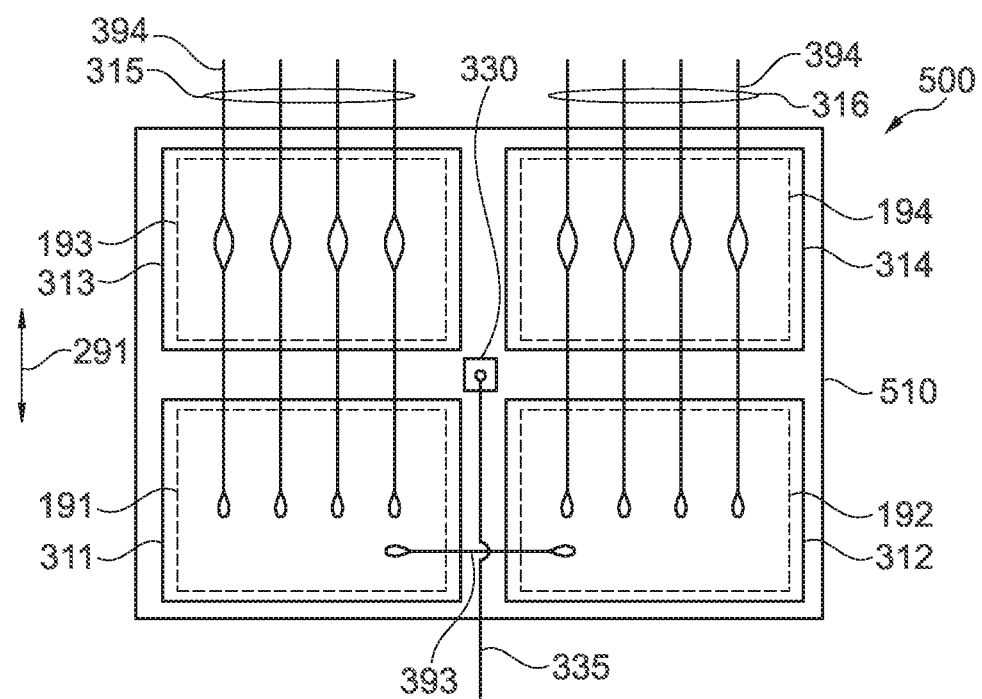
FIGS. 7A-7C illustrate schematic plan views of a semiconductor device according to further embodiments with pad connection structures including bond wires.
Figure 7B:
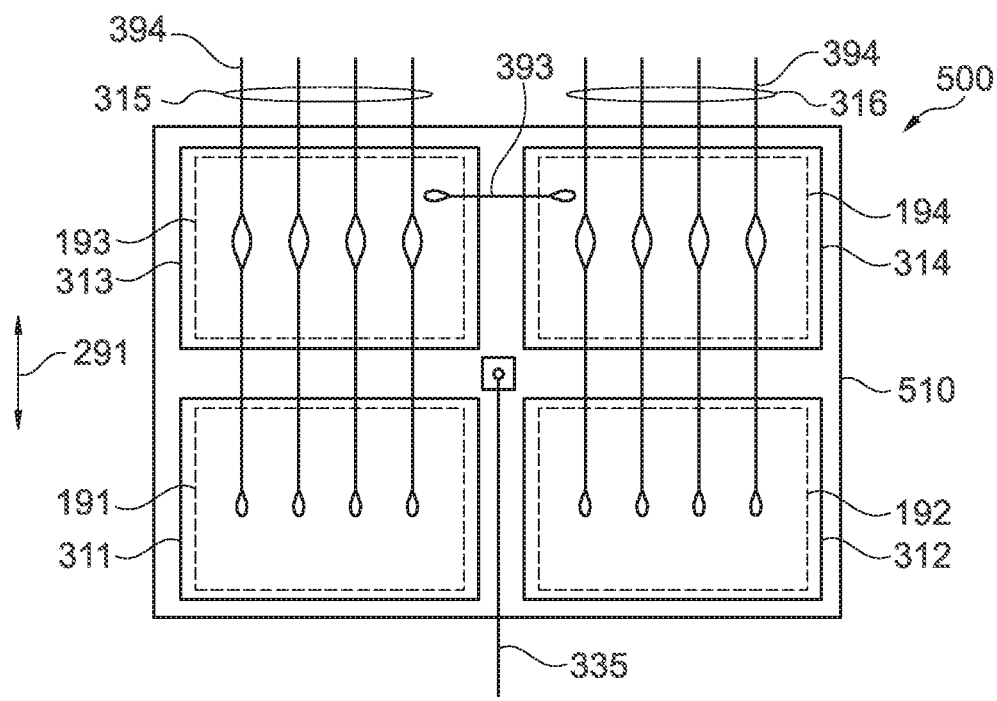
Figure 7C:
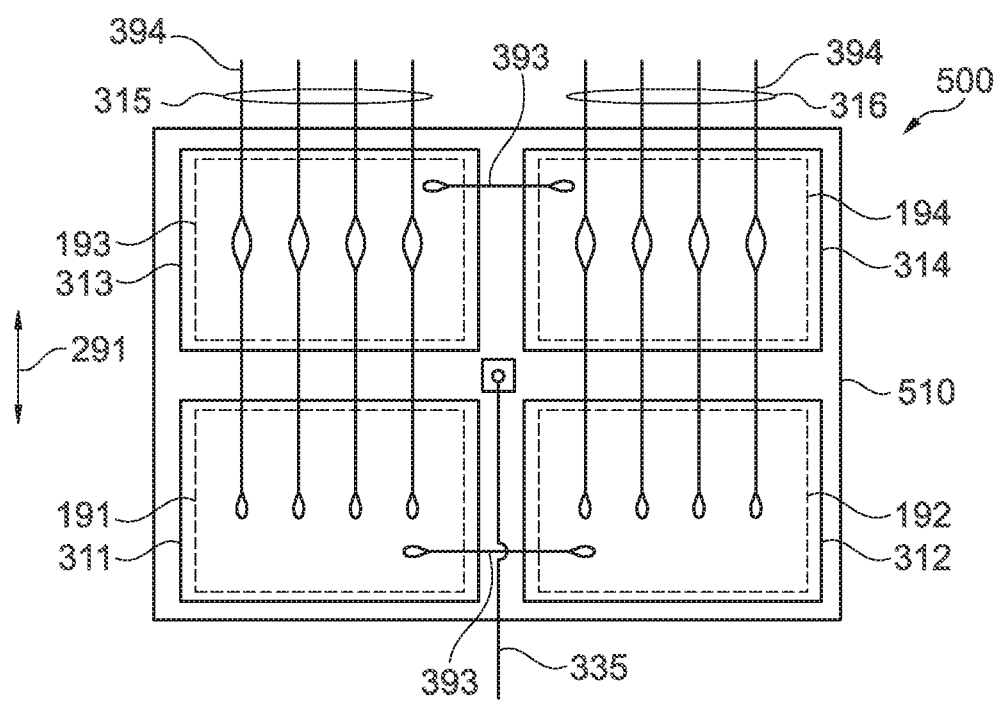

FIGS. 7A-7C show semiconductor devices 500 with semiconductor dies 510 that include a first load pad 311 electrically connected with first source regions in a first active portion 191, a second load pad 312 electrically connected with second source regions in a second active portion 192, a third load pad 313 electrically connected with third source regions in a third active portion 193, and a fourth load pad 314 electrically connected with fourth source regions in a fourth active portion 194. Gate structures (not illustrated) run parallel to the first direction 291.

Each semiconductor device 500 further includes a first load connection structure 315 that electrically connects the third load pad 313 and the first load pad 311 with a terminal and/or with another metal structure. The first load connection structure 315 may include a plurality of bond wires 394. The bond wires may be round bond wires or ribbon bond wires. A second load connection structure 316 connects the fourth load pad 314 and the second load pad 312 with the terminal and/or with the other metal structure. The second load connection structure 316 may include a plurality of bond wires. Above the semiconductor die 510, e.g., between bond contacts on the load pads 311, 312, 313, 314, the bond wires 394 may extend approximately parallel or slightly tilted to the longitudinal direction of gate trench structures in the semiconductor die 510.

The metal gate wiring 330 of the semiconductor die 510 may include a gate pad in the lateral center of the semiconductor die 510. According to another embodiment, the gate pad may be located along an edge of the semiconductor body 100 or in the corner of the semiconductor body 100. A gate bond wire 335 may electrically connect the gate pad with a gate terminal of the semiconductor device or with a gate metal line of an IGBT module.

FIG. 7A shows a pad connection structure 393 including a bond wire that crosses below or above the gate bond wire 335. The pad connection structure 393 may be formed close to that edge of the semiconductor body 100, which is opposite to the edge crossed by the first and second load connection structures 315, 316.

In FIG. 7B the pad connection structure 393 includes a bond wire that does not cross below or above the gate bond wire 335. The pad connection structure 393 may be formed close to that edge of the semiconductor body 100, which is crossed by the first and second load connection structures 315, 316.

In FIG. 7C the pad connection structure 393 includes a first bond wire that does not cross the gate bond wire 335 and a second bond wire that crosses above or below the gate bond wire 335. The first bond wire may be formed close to that edge of the semiconductor body 100, which is crossed by the first and second load connection structures 315, 316. The second bond wire may be formed close to that edge of the semiconductor body 100, which is opposite to the edge crossed by the first and second load connection structures 315, 316.

Figure 8A:
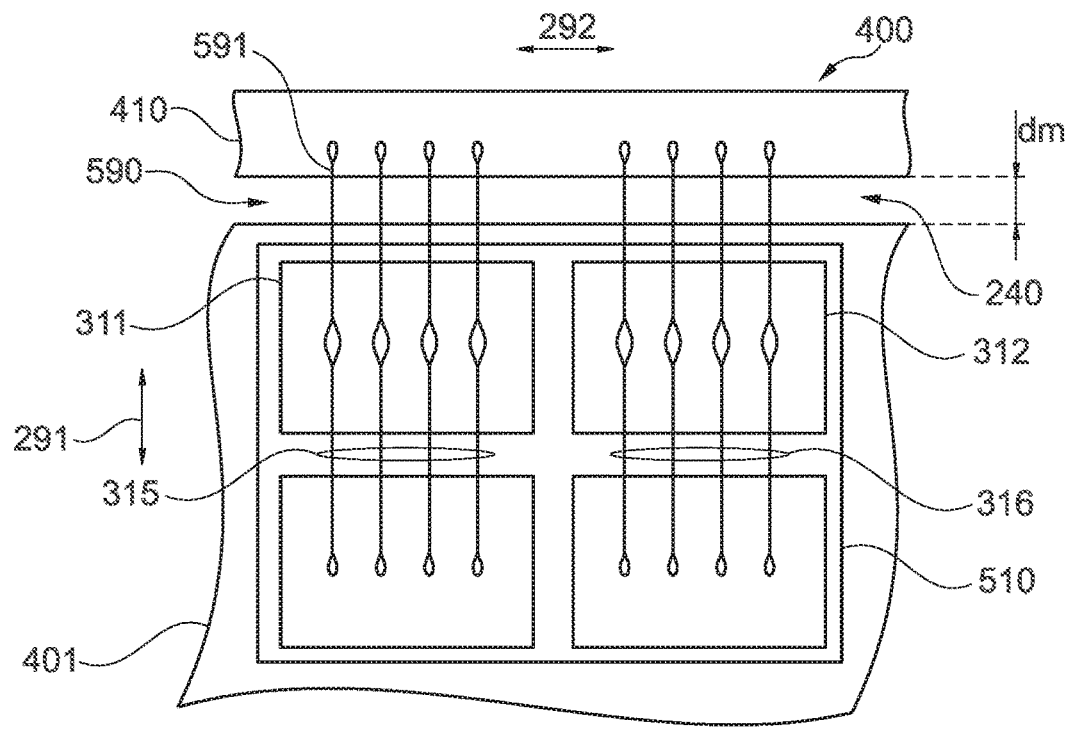
FIGS. 8A-8C illustrate schematic plan views of portions of IGBT modules according to embodiments including short wiring connection structures between load pads and metal structures.
Figure 8B:
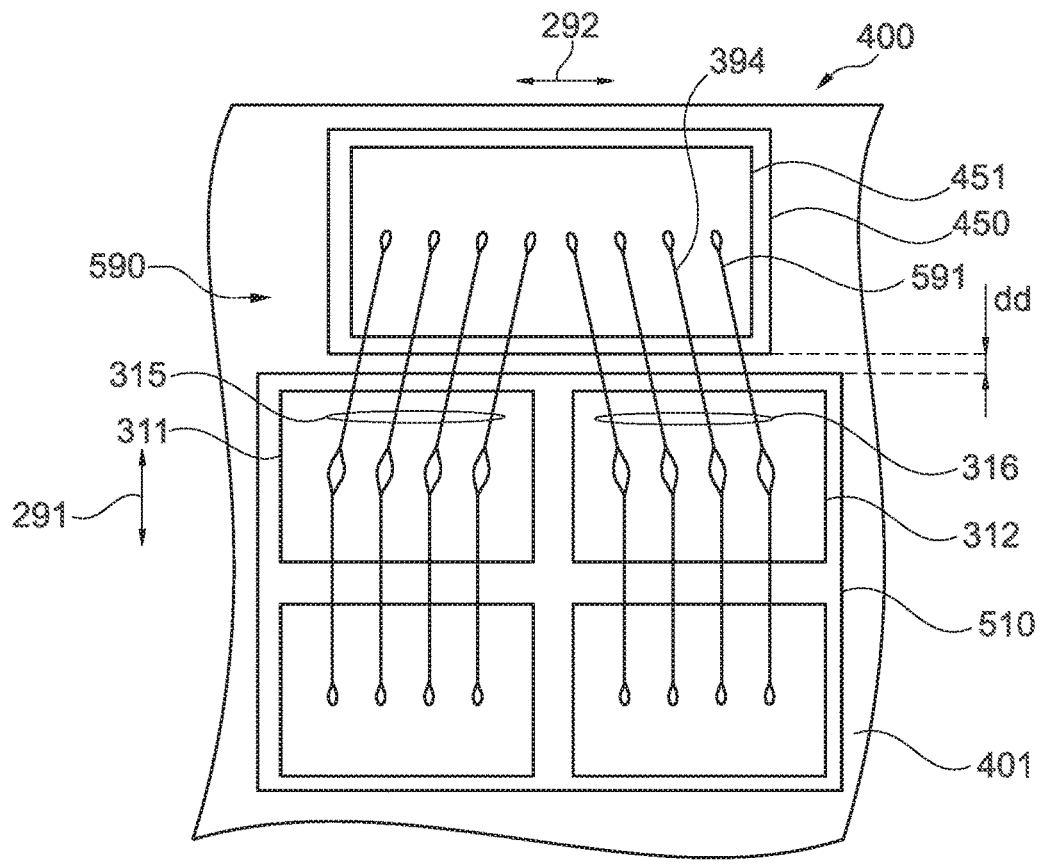
Figure 8C:
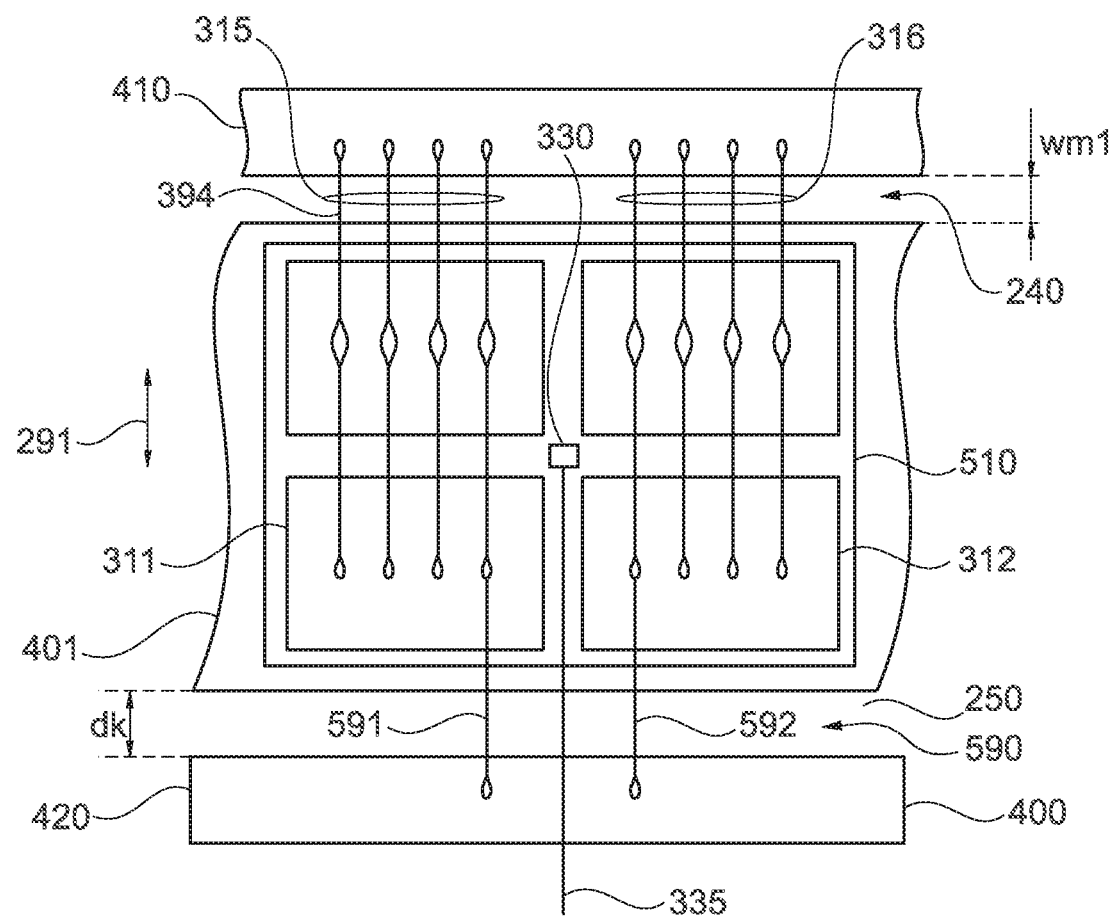

FIGS. 8A-8C show portions of IGBT modules that include a semiconductor die 510 with at least a first load pad 311 and a second load pad 312, a metal structure 400 and a wiring connection structure 590. Gate structures (not illustrated) run parallel to the first direction 291.

A backside of the semiconductor dies 510 may be soldered or sintered onto a collector plate 401. The wiring connection structure 590 may connect the first load pad 311 and the second load pad 312 via the metal structure 400. The inductance of the wiring connection structure 590 may be sufficiently low to efficiently suppress and/or damp oscillations in the load current path, e.g., at most 10 nH, at most 5 nH or at most 1 nH. For example, a lateral distance between the semiconductor die 510 and the metal structure 400 is at most 2 mm.

In FIGS. 8A-8B the wiring connection structure 590 includes a first load connection structure 315 and a second load connection structure 316 as described above. In the illustrated embodiment, each of the first and second load connection structures 315, 316 may include four or more bond wires.

In FIG. 8A the metal structure 400 is a load current plate 410. A first slit 240 may electrically separate the load current plate 410 and the collector plate 401. A first slit width dm is at most 2 mm. Orthogonal to the first direction 291 a lateral extension of the load current plate 410 is equal to or greater than the lateral extension of the semiconductor die 510. The bond wires of the first load connection structure 315 and the second load connection structure 316 may be formed without lateral bends. A vertical projection of each bond wire of the first load connection structure 315 and the second load connection structure 316 may be straight.

In FIG. 8B the metal structure 400 is the electrode pad 451 of a further semiconductor device 450. The further semiconductor device 450 may be a power semiconductor diode with a lateral extension orthogonal to the first direction 291 smaller than the lateral extension of the semiconductor die 510. A rear side electrode of the further semiconductor device 450 may be soldered or sintered onto the collector plate 401. The bond wires of the first load connection structure 315 and the second load connection structure 316 may be formed with lateral bends. A lateral distance dd between the semiconductor die 510 and the further semiconductor device 450 is at most 2 mm.

In FIG. 8C the metal structure 400 includes a Kelvin support structure 420. A second slit 250 may electrically separate the Kelvin support structure 420 and the collector plate 401. A second slit width dk is at most 2 mm.

The wiring connection structure 590 includes a first Kelvin bond wire 591 and a second Kelvin bond wire 592. The first Kelvin bond wire 591 electrically connects the first load pad 311 and the Kelvin support structure 420. The second Kelvin bond wire 592 electrically connects the second load pad 312 and the Kelvin support structure 420. A vertical projection of each Kelvin bond wire 591, 592 may be straight. The Kelvin support structure 420 may be electrically connected to a reference input of a high-impedance input stage of a gate driver circuit that outputs a gate signal supplied to the gate electrode of the semiconductor die 510. The Kelvin support structure 420 is outside any load current path.

The IGBT module further includes a first load connection structure 315 and a second load connection structure 316 connecting the first and second load pads 311, 312 with a load current plate 410 separated from the collector plate 401 by the first slit 240. In this embodiment the first slit width dm may be greater than 2 mm, because the Kelvin bond wires 591, 592 may provide a sufficient low-inductance coupling between the first load pad 311 and the second load pad 312.

Figure 9A:
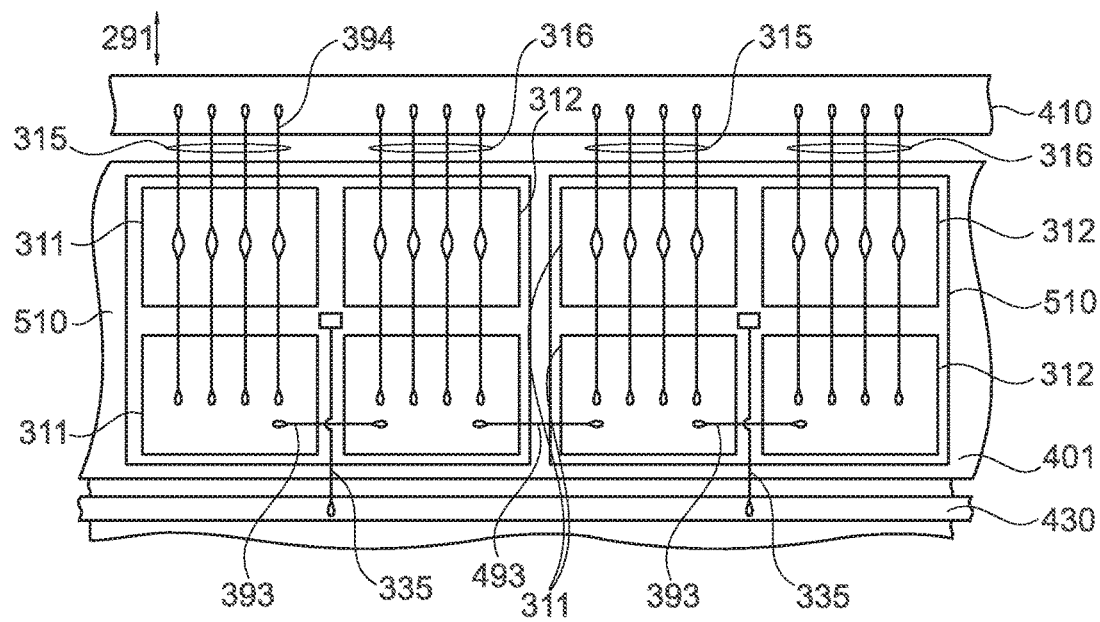
FIGS. 9A-9B illustrate schematic plan views of portions of IGBT modules with a plurality of IGBT semiconductor dies according to another embodiment.

FIG. 9A combines the embodiment of FIG. 7A with an inter-die connection 493 between two load pads 311, 312 of neighboring semiconductor dies 510. The inter-die connection 493 may be a further bond wire from the same type as the bond wires 393 of the intra-die pad connection structure. In addition, FIG. 9A shows a metal gate line 430 laterally separated from the collector plate 401. The gate wire bonds 335 electrically connect the gate metal wiring 330 with the metal gate line 430.

Figure 9B:
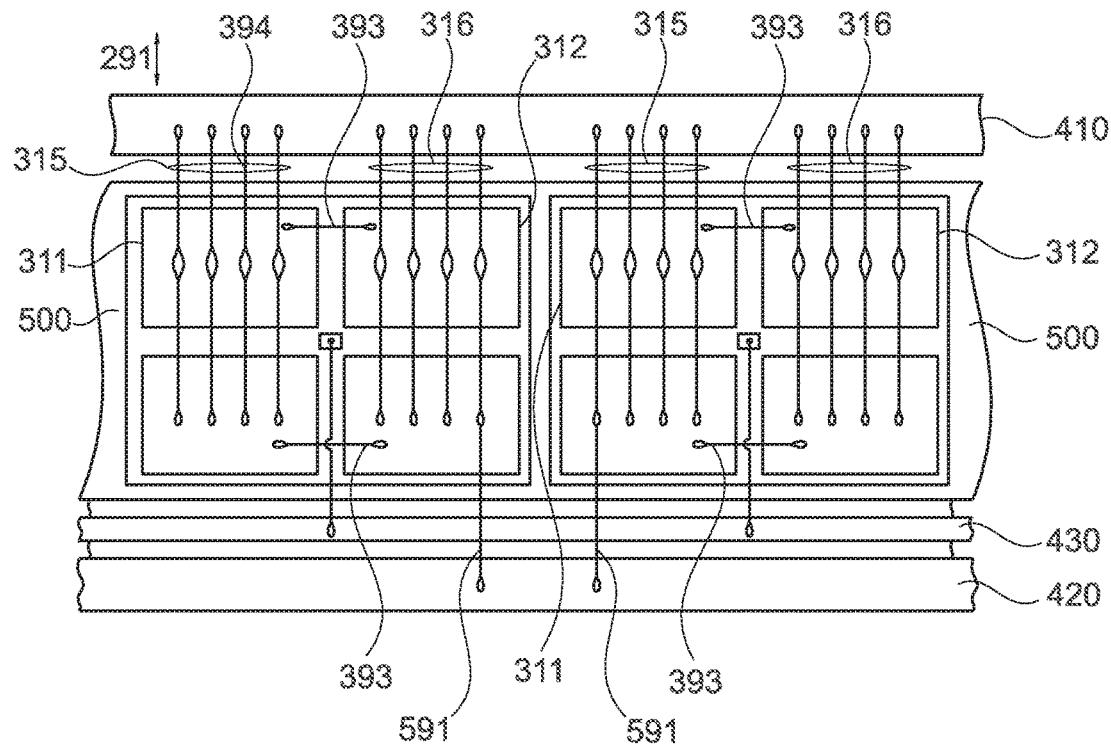

FIG. 9B combines the intra-die pad connection structure of FIG. 7C with an inter-die connection between two load pads 311, 312 of neighboring semiconductor dies 510 through Kelvin bond wires 591 and the Kelvin support structure 420.

According to another embodiment, a semiconductor die may include a semiconductor body, a gate structure, a first load pad, a second load pad and a connection structure. The semiconductor body may include a first active portion and a second active portion. The first active portion may include first source regions. The second active portion may include second source regions.

The gate structure may extend from a first surface into the semiconductor body. The gate structure may have a longitudinal gate extension along a lateral first direction. The first load pad and the first source regions may be electrically connected. The second load pad and the second source regions may be electrically connected. A gap may laterally separate the first load pad and the second load pad.

The connection structure electrically connects the first load pad and the second load pad. The connection structure may be formed in a wiring layer formed on the first surface and/or may be formed in a groove extending from the first surface into the semiconductor body. The connection structure, e.g., the connection structure formed in the groove may have a maximum lateral length extension, which is at most tenfold the gap width, e.g., at most twice the gap width.

A lateral longitudinal extension of the gap may be orthogonal to the first direction or may deviate from the first direction by not more than at least 30 degree.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor die, comprising:
   a semiconductor body comprising a first active portion and a second active portion, the first active portion comprising first source regions, the second active portion comprising second source regions;
   a gate structure extending from a first surface into the semiconductor body, the gate structure having a longitudinal gate extension along a lateral first direction;
   a first load pad electrically connected to the first source regions;
   a second load pad electrically connected to the second source regions, wherein a gap laterally separates the first load pad and the second load pad, wherein a lateral longitudinal extension of the gap is parallel to the lateral direction or deviates from the first direction by not more than 60 degree; and
   a connection structure electrically connecting the first load pad and the second load pad,
   wherein the connection structure is formed in a groove extending from the first surface into the semiconductor body and/or in a wiring layer formed on the first surface.

2. The semiconductor die of claim 1, wherein:
   the connection structure comprises a trench connection structure extending into the semiconductor body;
   the trench connection structure comprises a conductive portion and an insulating portion; and
   the insulating portion separates the conductive portion and the semiconductor body.

3. The semiconductor die of claim 2, wherein a longitudinal extension of the trench connection structure runs parallel to a longitudinal extension of the gap.

4. The semiconductor die of claim 2, wherein a longitudinal extension of the trench connection structure is tilted to a longitudinal extension of the gap.

5. The semiconductor die of claim 2, wherein the connection structure comprises a plurality of trench connection structures.

6. The semiconductor die of claim 2, further comprising:
   a trench electrode extending into the semiconductor body,
   wherein the conductive portion of the trench connection structure is in contact with the trench electrode.

7. The semiconductor die of claim 1, wherein the gap has a gap width orthogonal to the first direction, and wherein the gap width is at least 2 µm.

8. The semiconductor die of claim 7, wherein the connection structure has a maximum extension along a second direction, and wherein the maximum extension is at most a tenfold of the gap width.

9. The semiconductor die of claim 1, wherein the connection structure comprises a connection line formed on the semiconductor body, and wherein the connection line is formed outside the gap.

10. The semiconductor die of claim 1, further comprising:
a first trench electrode formed in the first active portion and extending into the semiconductor body, the first trench electrode and the first load pad being in direct contact;
a second trench electrode formed in the second active portion and extending into the semiconductor body, the second trench electrode and the second load pad being in direct contact; and
a source connection line formed on the semiconductor body,
wherein the source connection line and the first trench electrode are in direct contact,
wherein the source connection line and the second trench electrode are in direct contact,
wherein the connection structure comprises a portion of the source connection line extending from the first trench electrode to the second trench electrode.

11. The semiconductor die of claim 1, wherein the semiconductor body further comprises:
a drift region;
first body regions forming first pn junctions with the drift region and forming second pn junctions with the first source regions;
second body regions forming further first pn junctions with the drift region and forming further second pn junctions with the second source regions; and
a collector region, the collector region and the drift region forming a third pn junction, the drift region separating the collector region and the body regions.

12. A semiconductor device, comprising the semiconductor die of claim 1.

13. An IGBT (insulated gate bipolar transistor) module, comprising at least one of the semiconductor die of claim 1.

14. A semiconductor device, comprising:
a semiconductor body comprising a first active portion and a second active portion, the first active portion comprising first source regions, the second active portion comprising second source regions;
a first load pad electrically connected to the first source regions;
a second load pad electrically connected to the second source regions, wherein a gap laterally separates the first load pad and the second load pad;
a metal structure;
a first load connection structure connecting the first load pad and the metal structure; and
a pad connection structure electrically connecting the first load pad and the second load pad,
wherein the pad connection structure has a longitudinal extension angled at least 45° to the first load connection structure,
wherein the pad connection structure contacts the first load pad and the second load pad at a side located opposite to the semiconductor body.

15. The semiconductor device of claim 14, wherein the first load connection structure comprises a load bond wire.

16. The semiconductor device of claim 14, wherein the pad connection structure comprises a bond wire, and wherein the bond wire is in direct contact with the first load pad and with the second load pad.

17. The semiconductor device of claim 14, further comprising:
a second load connection structure connecting the second load pad and the metal structure, the first load connection structure and the second load connection structure being separated.

18. The semiconductor device of claim 17, wherein an electrical path of a bond wire attached to the first load pad and the second load pad is at least 50% shorter than an electrical path formed between the first load pad and the second load pad through the first load connection structure, the metal structure and the second load connection structure.

19. An IGBT (insulated gate bipolar transistor) module, comprising at least one of the semiconductor device of claim 14.

20. An IGBT (insulated gate bipolar transistor) module, comprising:
a semiconductor die, the semiconductor die comprising:
a semiconductor body comprising a first active portion and a second active portion, the first active portion comprising first source regions, the second active portion comprising second source regions;
a first load pad electrically connected to the first source regions; and
a second load pad electrically connected to the second source regions, wherein the first load pad and the second load pad are laterally separated;
a metal structure; and
a wiring connection structure electrically connecting the first load pad and the second load pad via the metal structure,
wherein the wiring connection structure comprises bond wires,
wherein the bond wires of the wiring connection structure have an inductance of at most 5 nH and/or a total damping constant of at least $5*10^5$ s$^{-1}$.

21. The IGBT module of claim 20, wherein the metal structure comprises at least one of a load current plate, a Kelvin support structure, and an electrode pad of a further semiconductor device.

22. The IGBT module of claim 20, wherein the bond wires of the wiring connection structure have an inductance of at most 1 nH.

* * * * *